United States Patent [19]

Shiotari

[11] Patent Number: 4,523,216

[45] Date of Patent: Jun. 11, 1985

[54] CMOS DEVICE WITH HIGH DENSITY WIRING LAYOUT

[75] Inventor: Yoshihisa Shiotari, Yokohama, Japan

[73] Assignee: Tokyo Shibaura Denki Kabushiki Kaisha, Japan

[21] Appl. No.: 354,034

[22] Filed: Mar. 2, 1982

[30] Foreign Application Priority Data

Apr. 24, 1981 [JP] Japan .................................. 56-62229

[51] Int. Cl.³ ...................... H01L 23/48; H01L 29/04; H01L 27/02
[52] U.S. Cl. ....................................... 357/42; 357/71; 357/59; 357/88
[58] Field of Search ...................... 357/42, 71 S, 59, 88

[56] References Cited

U.S. PATENT DOCUMENTS

| | | |
|---|---|---|
| 3,877,051 | 4/1975 | Calhoun et al. ...................... 357/71 |
| 4,163,242 | 7/1979 | Stein .................................. 357/71 S |
| 4,262,340 | 4/1981 | Sasaki et al. .......................... 357/42 |
| 4,322,736 | 3/1982 | Sasaki et al. .......................... 357/59 |
| 4,348,746 | 9/1982 | Okabayashi et al. ............... 357/71 S |
| 4,356,504 | 10/1982 | Tozun .................................. 357/42 |
| 4,392,150 | 7/1983 | Courreges .......................... 357/71 S |
| 4,412,237 | 10/1983 | Matsumura et al. .................. 357/41 |

FOREIGN PATENT DOCUMENTS 50-39477 4/1975 Japan .

Primary Examiner—Martin H. Edlow
Assistant Examiner—Jerome Jackson
Attorney, Agent, or Firm—Finnegan, Henderson, Farabow, Garrett & Dunner

[57] ABSTRACT

A CMOS device has P- and N-channel transistors sandwiching an isolation region formed on a semiconductor substrate. The drain regions, as well as the gate regions, of both transistors are connected by respective wiring layers made of polycrystalline silicon. Electrical contacts between the drain-connecting polycrystalline silicon wiring layer and each of the drain regions have a symmetrical structure in both transistors. In the electrical contacts, impurity diffusion regions having the same conductivity type as the drain regions and being contiguous with the drain regions are formed on the semiconductor substrate and the well region under the polycrystalline silicon wiring layer. Contact holes are formed in the insulating layer on the impurity diffusion region and on the drain region, and a conductive layer lies within the contact holes to connect the impurity diffusion regions to the polycrystalline silicon wiring layer. Further, a power source line and other wiring layers are provided on an isolation region between the transistors.

2 Claims, 7 Drawing Figures

CMOS DEVICE WITH HIGH DENSITY WIRING LAYOUT

BACKGROUND OF THE INVENTION

The present invention relates to a CMOS (Complementary Metal Oxide Semiconductor) device.

If a silicon gate CMOS transistor which has a gate made of electrically conductive polycrystalline silicon is used to constitute a logic circuit, the drain of a P-channel MOS transistor must be connected to that of an N-channel MOS transistor. FIG. 1 shows an IC pattern of a CMOS inverter manufactured by a known process wherein one gate electrode is made of N-type polysilicon and the other gate electrode is made of a P-type polysilicon by using a polysilicon layer 7 which is doped with different impurities. The CMOS inverter comprises an N-type semiconductor substrate 2, a P-channel MOS transistor region 1 formed on the substrate 2, a P-type well region 4 formed in the substrate 2, an N-channel MOS transistor region formed on the P-type well region 4, and patterned polycrystalline silicon wiring layers 5, 6 and 7. The layer 6 is provided for the drains of MOS transistors, and the layer 7 for the gate electrodes thereof. An N+-type impurity is doped in that portion of the layer 7 which lies on the P-channel transistor 1, and a P+-type impurity is doped in that portion of the layer 7 which lies on the N-channel transistor 3. The CMOS inverter further comprises aluminum interconnection layers 8, 9 and 10. The aluminum interconnection layer 10 connects the drains of the transistors 1 and 3. Further provided are an aluminum electrode 11 used as gate of each transistor, P+-type diffusion regions 12 and 13 used as the source and drain of the P-channel MOS transistor 1, and N+-type diffusion regions 14 and 15 used as the source and drain of the N-channel MOS transistor 3. Further, an isolation region 16 provided, isolating the transistors 1 and 3 from each other. The aluminum interconnection layer 8 is connected to the P+-type diffusion region 12 through a contact hole 17 made in an insulating layer interposed between the layer 8 and the region 12. Similarly, the aluminum interconnection layer 10 is connected to the P+-type diffusion region 13 through a contact hole 18 made in the insulating layer, the aluminum layer 9 is connected to the N+-type diffusion region 14 through a contact hole 19 made in the insulating layer. Further, the aluminum layer 10 is connected to the N+-type diffusion region 15 through a contact hole 20 made in the insulating layer, the polycrystalline layer 7 is connected to the aluminum electrode 11 through a contact hole 21 made in the insulating layer, and the polycrystalline silicon layer 6 is connected to the aluminum layer 10 through a contact hole 22 made in the insulating layer.

FIG. 2 shows an IC pattern of a CMOS inverter utilizing a polycrystalline silicon layer which is doped with a single type of impurity, for common gates, which is manufactured by a process more advanced than the process for making the CMOS inverter of FIG. 1.

FIG. 3 is a sectional view of the CMOS inverter shown in FIG. 2, taken along line X—X' in FIG. 2. In the silicon layer 7 of the CMOS inverter shown in FIG. 1 impurities of both P+-type and N+-type are doped, thus forming a PN junction. To nullify the PN junction it is necessary to make a contact hole 21 in the insulating layer and thus to put the aluminum electrode 11 into contact with the PN junction. Such a contact hole is unnecessary in the CMOS inverter of FIG. 2. This is because only one impurity is doped in the silicon layer 7 of the CMOS inverter shown in FIG. 2. With such a contact hole not provided, the CMOS inverter of FIG. 2 may have a higher IC density.

In both CMOS inverters shown in FIGS. 1 and 2, however, the contact hole 22 is indispensable. Without the hole 22, the polycrystalline silicon layer 6 could not be connected to the aluminum interconnection layer 10. Either CMOS inverter is thus longer in the lateral direction than otherwise. Furthermore, the space above the region 16 isolating the transistors 1 and 3 cannot be effectively used. This is a drawback inherent to a CMOS device.

SUMMARY OF THE INVENTION

It is an object of the present invention to provide a semiconductor device wherein the number of necessary contacts in a CMOS transistor IC device is reduced to the minimum and the space above an isolation region is effectively used, thus improving the IC density of the device.

To achieve the object, a semiconductor device according to the invention comprises a semiconductor substrate of a first conductivity type; a first transistor having a source region and a drain region of a second conductivity type formed in the semiconductor substrate spaced apart from one another and having an insulating gate layer formed over the substrate between the source and drain regions; a well region of a second conductivity type provided in the semiconductor substrate; a second transistor having a source region and a drain region of the first conductivity type formed in the well region spaced apart from one another and having an insulating gate layer formed over the well region between the source and drain regions and extending to reach the insulating gate layer of the first transistor to thereby form a first insulation layer, the source and drain regions of the first and second transistors being separated from one another by a portion of the substrate and by a portion of the well region which forms an isolation region between the transistors; a first wiring layer positioned on the first insulating layer to cross the isolation region and to form gate electrodes of the first and second transistors; a second wiring layer crossing the isolation region and electrically connecting the drain regions of the first and second transistors; a second insulating layer formed on the semiconductor substrate and on the well region for preventing the second wiring layer from directly contacting either the semiconductor substrate or the well region; a first electrical contact electrically connecting the drain region of the first transistor with the second wiring layer; a second electrical contact electrically connecting the drain region of the second transistor with the second wiring layer and having a structure the same as the structure of the first electrical contact; a third insulation layer disposed over at least those portions of the first and second wiring layers which are located over the isolation region; and a third wiring layer disposed over the isolation region so as to cross the first and second wiring layers at right angles.

DETAILED DESCRIPTION OF THE PREFERRED EMBODIMENT

Figure 5:
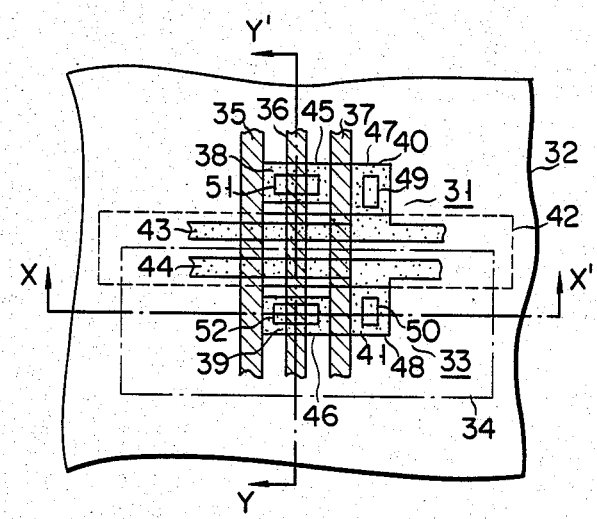
FIG. 5 shows an IC pattern of a CMOS inverter according to the present invention.

An embodiment of the invention will now be described with reference to FIGS. 5, 6 and 7. FIG. 5 shows the IC pattern of a CMOS inverter according to the present invention. The CMOS inverter comprises an N-type semiconductor substrate 32, a P-channel MOS transistor region 31 formed on the substrate 32, a P-type well region 34 formed in the substrate 32 and an N-channel MOS transistor region 33 on the P-type well region 34. Polycrystalline silicon interconnection layers 35, 36 and 37 are provided. The layer 36 connects the drains of both P- and N-channel transistors. The layer 37 connects the gates of both transistors, and it therefore functions as gate electrodes of both transistors as well. Further provided are aluminum electrodes 38, 39, 40 and 41. The aluminum electrode 38 is connected to the drain of the P-channel transistor, and the aluminum electrode 39 to the drain of the N-channel transistor. The aluminum electrode 40 is connected to the source of the P-channel transistor, and the aluminum electrode 41 to the source of the N-channel transistor. The aluminum electrode 40 is connected by an aluminum interconnection layer 43 to a power source. The aluminum electrode 41 is connected by an aluminum interconnection layer 44 to the power source. Both aluminum interconnection layers 43 and 44 are formed in an isolation region 42 which isolates the P- and N-channel transistors 31-33. Isolation region 42, as shown in FIG. 5, is a region between transistor 31,33 which physically separates these transistors. In effect, the layers 43 and 44 are formed integral with the electrodes 40 and 41, respectively. A P+-type diffusion region 45 and an N+-type diffusion region 46 are provided, the former being the drain of the P-channel MOS transistor and the latter being the drain of the N-channel MOS transistor. Further another N+-type diffusion region 48 is provided, which serves as the source of the N-channel MOS transistor. An insulating layer having contact holes 49, 50, 51 and 52 is formed on the substrate 32. Through the hole 49 the aluminum electrode 40 is connected to the P+-type diffusion region 47. Through the hole 50 the aluminum electrode 41 is connected to the N+-type diffusion region 48. Through the hole 51 the silicon interconnection layer 36 is connected to the P+-type diffusion region 45. And through the hole 52 the silicon interconnection layer 36 is connected to the N+-type diffusion region 46. The contact holes 51 and 52 serve to fabricate a so-called double contact.

Figure 6:
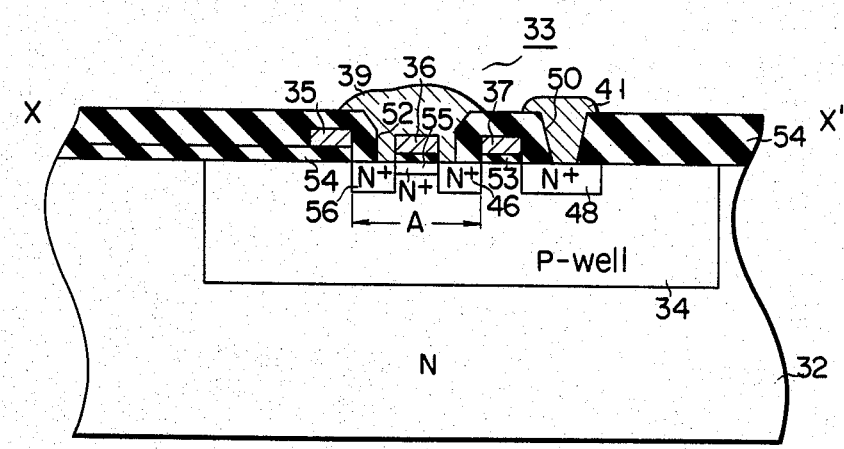
FIG. 6 is a sectional view of the CMOS inverter shown in FIG. 5, taken along line X—X' in FIG. 5.

FIG. 6 is a sectional view of the N-channel transistor region 33 shown in FIG. 5, taken along line X—X'. As shown in FIG. 6, the CMOS inverter is provided with two oxide layers 53 and 54 and N+-type diffusion regions 55 and 56. The N+-type diffusion regions 55 and 56 are formed in the P-type well region 34, with their upper surfaces positioned flush with that of the P-type well region 34. The N+-type diffusion regions 46, 55 and 56 constitute the above-mentioned double contact, which horizontally extends for a distance A. In that portion of the oxide layer 54 where the silicon interconnection layer 36 intersects with the aluminum interconnection layer 39 the contact hole 52 is made. Below that portion of the silicon layer 36 which lies in the contact hole 52 the N+-type diffusion region 55 is positioned. The N+-type diffusion region 46 and the N+-type diffusion region 56 are so positioned that they sandwich the N+-type diffusion region 55, which prevents a short-circuit between the aluminum layer 39 and the P-type well region 34. The P-channel transistor region has the same structure as the N-channel transistor.

Figure 7:
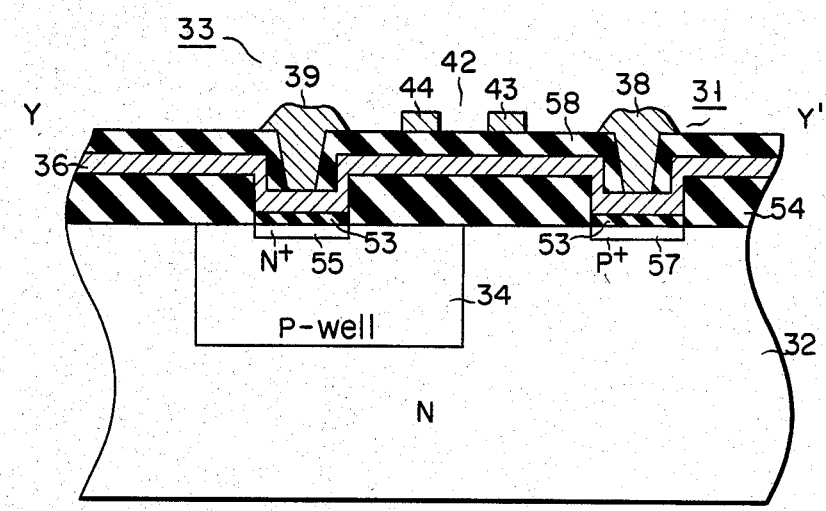
FIG. 7 is another sectional view of the CMOS inverter shown in FIG. 5, taken along line Y—Y' in FIG. 5.

FIG. 7 is a sectional view of the CMOS inverter of FIG. 5, taken along line Y—Y' in FIG. 5. As illustrated in FIG. 7, the CMOS inverter is provided with another P+-type diffusion region 57 which lies below the aluminum electrode 38. It is also provided with an insulating film 58.

In the CMOS inverter of FIG. 5 the polycrystalline silicon interconnection layer 36 connects the drains of both transistors, whereas an aluminum interconnection layer connects the drains of both transistors in the conventional CMOS inverter. Thanks to the use of the polycrystalline silicon layer 36, a double contact is formed of the N+-type diffusion regions 46, 55 and 56. Hence, it is possible to provide above the isolation region 42 the aluminum interconnection layers 43 and 44 which are connected to a power source. In the CMOS inverter shown in FIGS. 5 to 7, the N+-type diffusion region 46 functions as a drain. Nonetheless, the N+-type diffusion regions 46, 55 and 56 may generally be called "drains".

Figure 1:
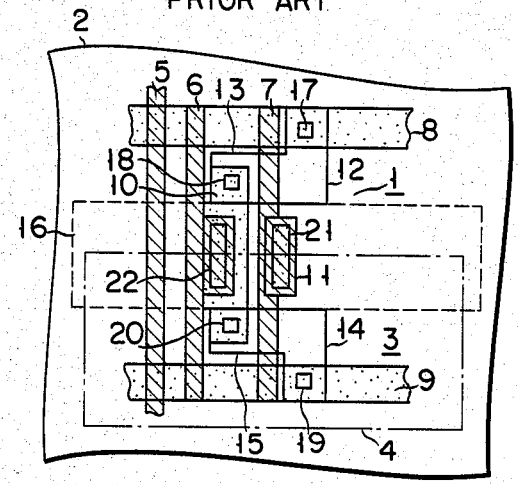
FIG. 1 shows a known IC pattern of a CMOS inverter.
Figure 2:
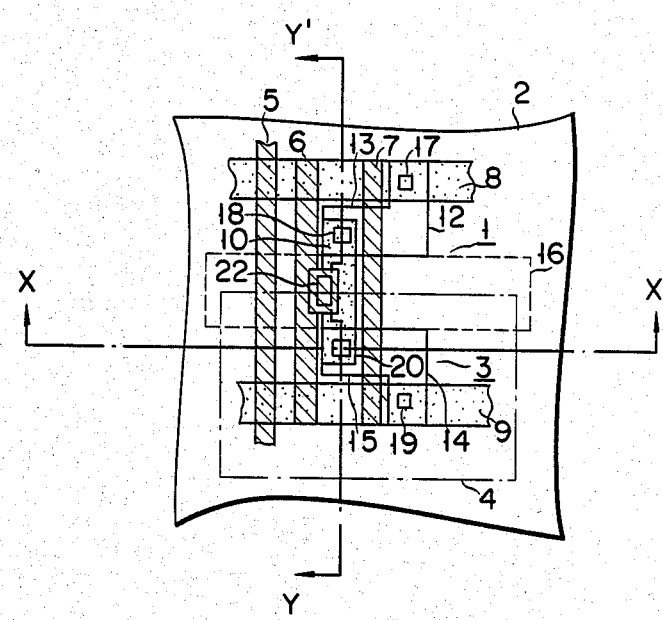
FIG. 2 shows another known IC pattern of a CMOS inverter, which is advanced over the IC pattern of FIG. 1.
Figure 3:
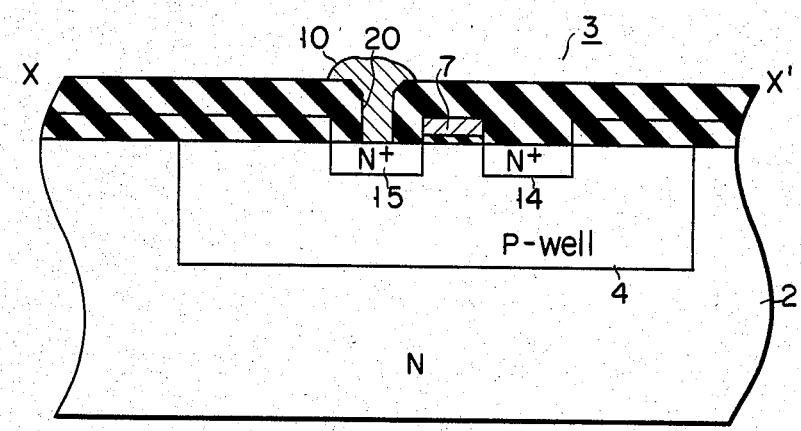
FIG. 3 is a sectional view of the CMOS inverter shown in FIG. 2, taken along line X—X' in FIG. 2.
Figure 4:
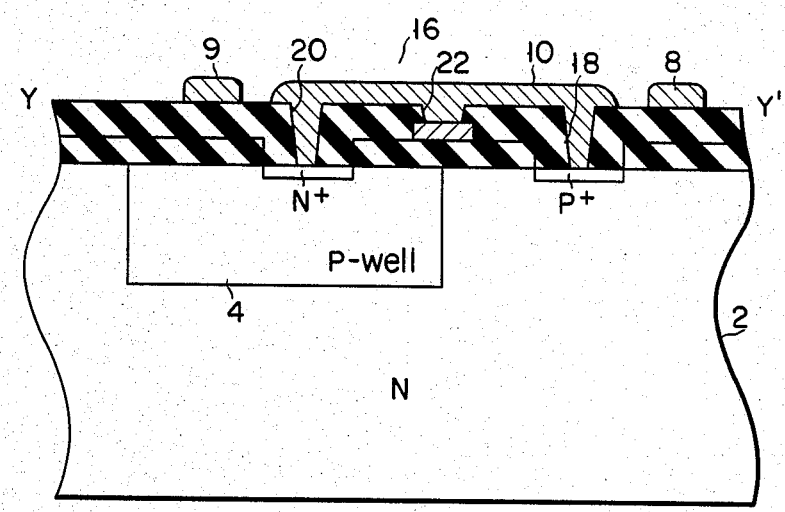
FIG. 4 is a sectional view of the CMOS inverter shown in FIG. 2, taken along line Y—Y' in FIG. 2.

As clearly shown in FIG. 5, the CMOS inverter of the invention requires one less contact hole than the conventional CMOS inverter shown in FIG. 2. This helps to enhance the yield of the CMOS inverter. In addition the CMOS inverter is much shorter than the conventional one in the lateral direction. Moreover, the silicon interconnection layer 36, which connects the drains of both transistors may be connected to the gates of both transistors of another CMOS inverter, whereby a composite logic circuit may be constituted. Still further, since the space above the isolation region 42 is effectively utilized, the CMOS inverter is much shorter than the conventional CMOS inverter, in the direction along line Y—Y'.

In the above-described embodiment the layers 35, 36 snd 37—all connecting the N- and P-channel transistors—are made of polycrystalline silicon. Instead, they may be made of molybdenum or other metals.

What is claimed is:

1. A CMOS device comprising:
    a semiconductor substrate of a first conductivity type;
    a first transistor having a source region and a drain region of a second conductivity type formed in said semiconductor substrate spaced apart from one another, and having an insulation gate layer formed over said substrate between said source and drain regions;
    a well region of said second conductivity type provided in said semiconductor substrate;
    a second transistor having a source region and a drain region of said first conductivity type formed in said well region spaced apart from one another and having an insulation gate layer formed over said well region between said source and drain regions and extending to said insulation gate layer of said first transistor to thereby form a first insulation layer, said source and drain regions of said first and second transistors being separated from one another by a portion of said substrate and by a portion of said well region which forms an isolation region between said transistors;

a first wiring layer positioned on said first insulating layer to cross said isolation region and to form gate electrodes of said first and second transistors;

a second wiring layer crossing said isolation region and electrically connected the drain regions of said first and second transistors;

a second insulating layer formed on said semiconductor substrate and on said well region for preventing said second wiring layer from directly contacting either said semiconductor substrate or said well region;

a first electrical contact electrically connecting the drain region of said first transistor with said second wiring layer;

a second electrical contact electrically connecting the drain region of said second transistor with said second wiring layer and having a structure the same as the structure of said first electrical contact;

a third insulating layer disposed over at least those portions of said first and second wiring layers which are located over said isolation region; and a power source wiring layer disposed over said isolation region so as to cross said first and second wiring layers at right angles.

2. A CMOS device according to claim 1, wherein each of said first and second electrical contacts comprises an impurity diffusion region having the same conductivity type as said drain region and being located in said semiconductor substrate and well region surfaces, respectively, contiguous with said respective drain regions, lying, at least in part, below said second wiring layers and electrically isolated from said second wiring layers by said second insulating layer; a contact hole formed in said second insulating layer over said impurity diffusion regions and said drain regions of each said transistor; and a conductive layer in each contact hole, said second wiring layer being electrically connected by said conductive layer and said impurity diffusions regions to said respective drain regions.

* * * * *